United States Patent
Andle et al.

(10) Patent No.: US 9,673,777 B2
(45) Date of Patent: Jun. 6, 2017

(54) QUARTZ SUBSTRATE ORIENTATIONS FOR COMPACT MONOLITHIC DIFFERENTIAL TEMPERATURE SENSOR, AND SENSORS USING SAME

(71) Applicant: Transense Technologies PLC, Bicester (GB)

(72) Inventors: Jeffrey C. Andle, Falmouth, ME (US); Victor Kalinin, Headington (GB)

(73) Assignee: Transense Technologies PLC (GB)

( * ) Notice: Subject to any disclaimer, the term of this patent is extended or adjusted under 35 U.S.C. 154(b) by 430 days.

(21) Appl. No.: 14/358,123

(22) PCT Filed: Nov. 9, 2012

(86) PCT No.: PCT/US2012/064500
§ 371 (c)(1),
(2) Date: May 14, 2014

(87) PCT Pub. No.: WO2013/074422
PCT Pub. Date: May 23, 2013

(65) Prior Publication Data
US 2014/0319964 A1    Oct. 30, 2014

Related U.S. Application Data

(60) Provisional application No. 61/561,154, filed on Nov. 17, 2011.

(51) Int. Cl.
H03H 9/02 (2006.01)
G01K 11/26 (2006.01)

(52) U.S. Cl.
CPC ....... H03H 9/02551 (2013.01); G01K 11/265 (2013.01)

(58) Field of Classification Search
CPC ................ H03H 9/02535; H03H 9/02551
(Continued)

(56) References Cited

U.S. PATENT DOCUMENTS

| 4,400,640 A | 8/1983 | Cho et al. |
| 4,670,680 A | 6/1987 | Andle |

(Continued)

FOREIGN PATENT DOCUMENTS

| WO | 2006016123 | 2/2006 |
| WO | 2006123085 | 11/2006 |

OTHER PUBLICATIONS

International Search Report dated Jan. 25, 2013, from Int'l. Stage PCT Application PCT/US/2012/064500.
(Continued)

*Primary Examiner* — Derek Rosenau
(74) *Attorney, Agent, or Firm* — Keusey & Associates, P.C.

(57) ABSTRACT

Quartz cuts are provided which exhibit temperature characteristics which are favorable for making differential SAW temperature sensors. Families of Y cuts rotated between 0° and 60° degrees in combination with placement of two resonators at specified angles to each other are disclosed. Further, preferred embodiments in which the resonators are placed on opposite sides of a zero TCF line are disclosed, to provide wide temperature differences while efficiently utilizing the available bandwidth. The design permits placement of the resonator at angles smaller than 12.5° and even less than 5° therebetween, most preferably on quartz rotated Y cut between 28.5° and 42.75°.

14 Claims, 4 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 6,774,747 | B2 | 8/2004 | Yamazaki et al. |
| 7,042,133 | B2 | 5/2006 | Kanna |
| 7,151,337 | B2 | 12/2006 | Kalinin et al. |
| 7,511,587 | B2 * | 3/2009 | Martin ............ H03B 5/326 331/107 A |
| 7,795,779 | B2 | 9/2010 | Kalinin |
| 2005/0001511 | A1 * | 1/2005 | Kalinin et al. ......... G01D 5/485 310/313 A |
| 2009/0133504 | A1 | 5/2009 | Kalinin |
| 2010/0186513 | A1 | 7/2010 | Kalinin |
| 2010/0237959 | A1 | 9/2010 | Tanaka |
| 2014/0225684 | A1 * | 8/2014 | Kando et al. ...... H03H 9/02559 333/195 |

OTHER PUBLICATIONS

International Preliminary Examination Report dated Jan. 25, 2013, from Int'l. Stage PCT Application PCT/US/2012/064500.
Written Opinion dated Jan. 25, 2013, from Int'l. Stage PCT Application PCT/US/2012/064500.
Buff, W. et al., "Passive Remote Sensing for Temperature and Pressure Using SAW Resonator Devices," IEEE Transactions on Ultrasonics, Ferroelectrics, and Frequency Control, Sep. 1998, vol. 45, No. 5: 1388-1392.
Supplemental Search Report from European Patent Office in EP12849998 dated Jul. 7, 2015.

* cited by examiner

QUARTZ SUBSTRATE ORIENTATIONS FOR COMPACT MONOLITHIC DIFFERENTIAL TEMPERATURE SENSOR, AND SENSORS USING SAME

FIELD OF THE INVENTION

The present invention is directed generally towards resonant monolithic differential Surface Acoustic Wave (SAW) temperature sensors, and more particularly to providing crystallographic orientations of quartz crystals that are beneficial for creation of compact differential temperature sensors, and towards sensors using the same.

BACKGROUND OF THE INVENTION

Acoustic Wave Device (AWD) based devices, and more commonly Surface Acoustic Wave (SAW) devices, provide high frequency devices with well controlled delay times or resonant frequencies in a compact structure. The manufacture of SAW devices is consistent with wafer processes developed for the semiconductor industry. SAW devices use the piezoelectric property of certain crystals to couple an electromagnetic signal to an acoustic wave. In the case of the SAW, the acoustic wave is trapped to the surface of the device, where it readily interacts with thin film structures such as reflectors and interdigital transducers. SAW devices have been prized for the past 40 years for their unparalleled ability to provide long time delay (microseconds) in a small size (millimeters) with low loss (single dB's) and to provide resonators with Q in excess of 10,000 at UHF radio frequencies.

There is widespread and growing interest in the use of SAW resonators and delay lines as sensors. These devices utilize at least one device which is made to be sensitive to a physical or chemical property of the environment.

Many quartz resonators change their operation parameters such as insertion loss, phase relationships, frequency, and similar characteristics, in response to changes in ambient temperature. Generally this phenomenon has been considered a nuisance for the design of stable SAW based filters and resonators, and significant research was performed to minimize the effects of temperature on SAW's.

For brevity, these specifications would provide example embodiments and discussion relating to a temperature sensor, utilizing SAW resonators as sensor elements, and frequency change $\Delta F$ as the sensed parameter. The skilled in the art would readily recognize however that the specifications and the claims extend to equivalent modifications of the teachings provided herein, utilizing delay lines or other SAW structures as sensor elements, and using propagation delay, phase differences, and the like as the sensed parameters.

Examples of research into extremely temperature stable frequency control and timing devices include, by way of example, U.S. Pat. No. 7,042,133 to Kanna, and U.S. Pat. No. 4,400,640 to Williams and Cho. However, orientations may also be chosen that are not temperature compensated and may be utilized for temperature measurements by sensing one of the temperature-dependent SAW operating parameters. Commonly, the sensed operating parameter is frequency.

Wireless sensors utilizing SAW's are well known in the art. When exposed to a pre-set signal from a transmitter, such sensors re-radiate Radio Frequency (RF) energy, or otherwise disrupt the RF energy field, in a manner that conveys information about the parameter they are designed to measure. The re-radiated energy or field disruption is received by a receiver which allows the information to be used. The excellent delay time or resonant Q of SAW devices allows the return signal to be examined microseconds after the transmitter has been silenced, affording exquisite signal to noise performance. This technology is colloquially known as a 'passive device' or 'passive sensor'.

In "*Passive Remote Sensing for Temperature and Pressure Using SAW Resonator Devices*", Buff et al. *IEEE transactions on ultrasonics, ferroelectrics, and frequency control*, vol. 45, no. 5, pp. 1388-1392, September 1998 Buff showed a SAW based temperature and pressure sensors that utilized two resonators as sensor elements. The resonators were deposited on a so-called 35° Rotated Y Cut (RYC) quartz crystal, with 35° angle between the plate normal axis and the crystallographic axis. Such differential schemes employ two nearly identical devices which share sensitivity to other ambient conditions but have different sensitivity to the desired measurement condition.

The shared sensitivity of the two elements is known as 'common mode', and, when properly balanced, it provides compensation against the undesired effects of non-related environmental conditions on the measurement of interest. For example, as the disturbing influence of changes in the antenna impedance cause significant inaccuracies in SAW based passive sensors, the differential design offers significant advantages, as the frequency response of both sensor elements shift essentially identically in response to antenna loading. Aging, package stress induced shifts and many manufacturing variations are also seen to be compensated in at least some well designed differential sensors.

Certain embodiments of differential temperature sensors utilize two sensor elements which do not reside on the same die, such as dies which come from wafers of different orientations, and the like. The sensor elements are placed in the same ambient conditions. These embodiments offer the advantage of small size: the overall dimensions may be made as small as twice the size of a single device. However, the manufacturing variations of the two devices are uncorrelated, requiring large tolerances of individual frequencies and offering poor correlation of environmental sensitivity to undesired influences. Monolithic sensors, which are sensors where the two sensing elements are manufactured on a single substrate, are more common. However the monolithic differential sensors of prior designs suffer from larger size and other disadvantages related to the angle between the two monolithic sensor elements. The efficacy of such common mode compensation depends entirely on the similarity of the two elements of the differential sensor, but the differences between the elements that afford differential temperature sensitivity also introduce variations in the sensitivity to common mode effects, impairing compensation.

U.S. Pat. No. 6,774,747 to Yamazaki et al. discloses a non-negligible metal film employed for the reflectors and transducers of the SAW resonator. It further discloses the use of singly-rotated quartz orientations from 23° to 45° with propagation directions between 40 and 49° and a metallization ratio less than 50%, more preferably 32%, and the thickness of the metal film being 6% of the acoustic wavelength. This resulted in lowering the temperature sensitivity for a singly rotated cut, offering improved frequency/temperature stability. Yamazaki also discloses a propagation direction for each quartz orientation that is also a function of metal thickness for which the frequency of a single resonator is optimally stable over temperature.

U.S. Pat. No. 7,042,133 to Kanna presents a plurality of resonators based on the structure of U.S. Pat. No. 6,774,747, the resonators having overlapping resonant frequency passbands and connected so as to form a single composite resonator with a single resonant frequency. The aggregate resonator of such a structure was found to have even better frequency/temperature stability. It should be noted that the device of Kanna is clearly distinguished from sensors (discussed below) wherein multiple resonators with non-overlapping passbands are employed in differential sensing schemes, either connected in parallel or individually instrumented. The goal of frequency control devices is to minimize dependency on temperature fluctuations while the temperature sensors rely primarily on such fluctuation and seeks to maximize it as long as it is predictable and preferably linear over the measured range.

The Buff et al. design used an inter-element angle of 35°. As a result of the large angle between the resonators, the die is actually required to be wider than it is long, a decided cost disadvantage to the separate die implementation. The manufacturing variations are well correlated only to the degree to which the angle between the two resonators is sufficiently small that their sensitivities of nominal frequency to metal thickness, line-width variations, and misalignment are all correlated; however, the requisite small angle between sensor elements typically results in low differential sensitivity. Other angles have been practiced, ranging between 15° in a torque and temperature sensor, 18° in a tire pressure and temperature sensor, and 35° in Buff's temperature sensor. The poor correlation of resonant frequencies of the two sensor elements in mass production when using large angles leads to one element or the other being outside of specification. If either element is out of specification, the entire die is discarded, so the disadvantage of larger size is compounded by increased yield losses.

In addition to a large die size and manufacturing variations of the nominal frequencies, the temperature sensitivity of the individual elements are also well correlated only if the angle between the two resonators is sufficiently small that their sensitivities of temperature coefficient to metal thickness, line-width variations, and misalignment are all correlated. Correlation of the temperature sensitivity of the elements over manufacturing variations requires relatively small angles; however, utilizing a small angle under the prior art would typically result in low differential sensitivity Therefore there is a clear but as of yet unresolved need for a small and inexpensive, yet accurate SAW based sensor. Ideally such sensor would utilize a suitable substrate orientation angle, suitable metal thickness, and two carefully selected propagation directions. The ideal substrate would have a differential resonant frequency change responsive to temperature (TCdF) which is monotonic, and preferably linear, over the desired measurement range, and preferably have a relatively large slope for better resolution. Having a sufficiently low slope to operate over the desired temperature range while staying within an unregulated radio frequency band is also a desired characteristic. The ideal substrate would also be very stable regarding all other parameters. Most preferably, the frequency response to temperature change of each of the two sensor elements would be in opposite directions.

SUMMARY OF THE INVENTION

It is therefore a goal of the present invention to provide a solution to the shortcomings of the prior art. A further goal of the present invention is providing crystallographic cut orientations in quartz and ranges of propagation angle pairs thereupon that will be favorable to monolithic differential passive SAW temperature sensors.

It is a goal of another aspect of the invention to provide sensors disposed on quartz cuts as disclosed herein.

To those ends there are provided substrates chosen from a family of quartz cut orientations which are favorable to manufacturing such sensors. Furthermore, metal thicknesses providing pairs of propagation directions offering improved compensation of common mode manufacturing and environmental influences are also provided. Certain combinations of those substrates, metal thicknesses, and propagation directions, result in a high sensitivity to temperature, showing difference frequency (>3 KHz/° C. at 434 MHz) with a small angle between the sensor elements, typically less than 5°. While the difference in propagation directions between 5° and 10° are acceptable, an angle exceeding 12.5° showed little benefit.

In relation to angle between resonators and/or other sensor elements, the term angle should be construed to mean the planar angle parallel to the plate surface, between the longitudinal axes of the sensor elements. The longitudinal axes are defined as being along the Poynting vectors, typically followed by the bus bars, since it is this angle that determines the minimum size increase of a sensor. This is closely related to the difference in phase velocity propagation direction, the direction perpendicular to the electrodes, which determines the properties of the acoustic wave.

SHORT DESCRIPTION OF DRAWINGS

The summary, above, and the following detailed description will be better understood in view of the enclosed drawings which depict details of preferred embodiments. It should however be noted that the invention is not limited to the precise arrangement shown in the drawings and that the drawings are provided merely as examples.

Figure 3:
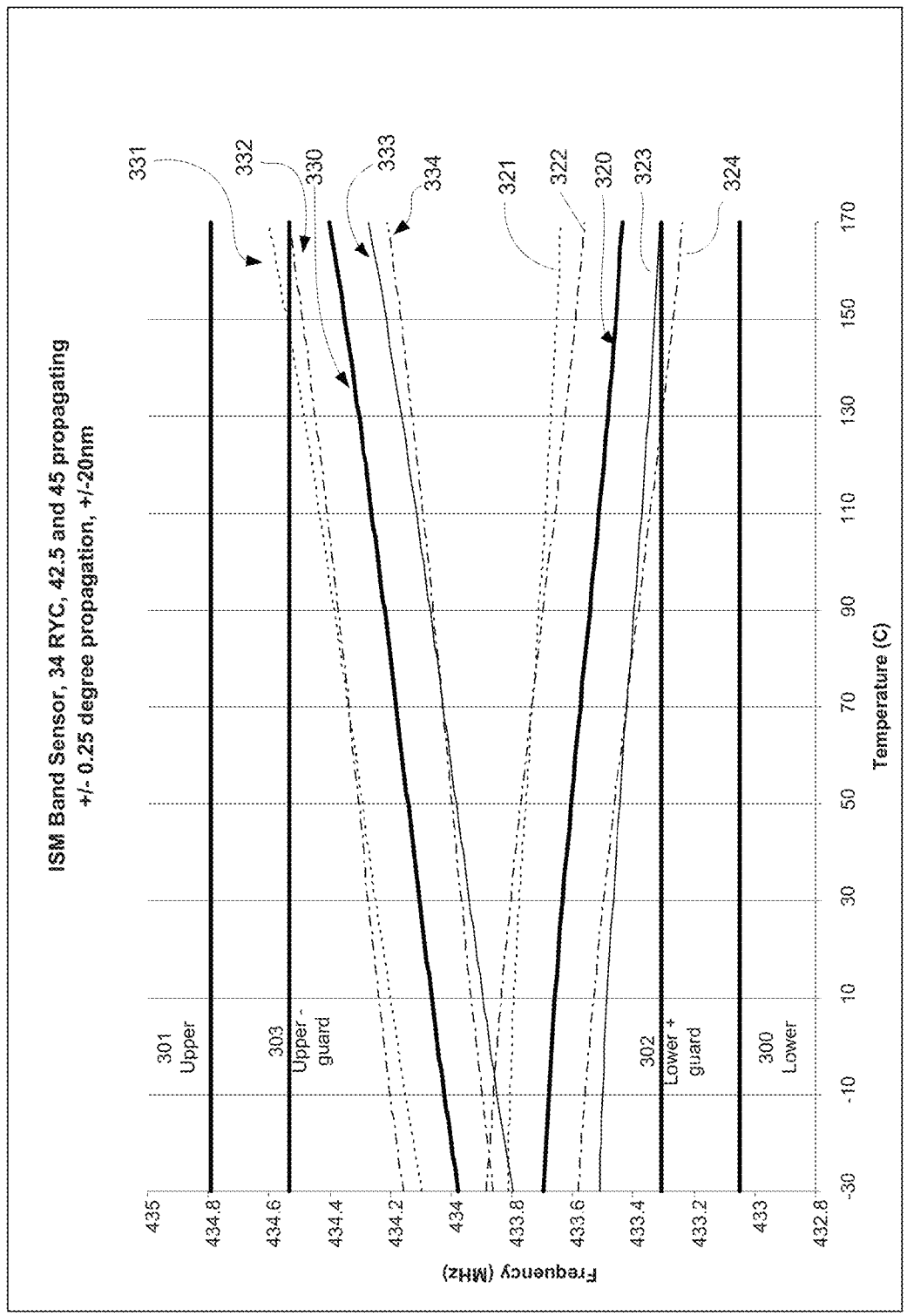

FIG. 3 depicts an initial design of a differential temperature sensor intended to operate from −25° C. to +175° C. while remaining within a frequency range inset from the 433 MHz European ISM band by 255 KHz. The design allows for individual element variations from misalignment and metal thickness while maximizing the differential sensitivity allowed within the ISM band to attain approximately 3 KHz/° C. (6.9 parts per million per ° C.) with only a 2.5° difference in phase velocity directions. Accounting for other device asymmetry the net angle between elements is 4.8°.

Figure 4:
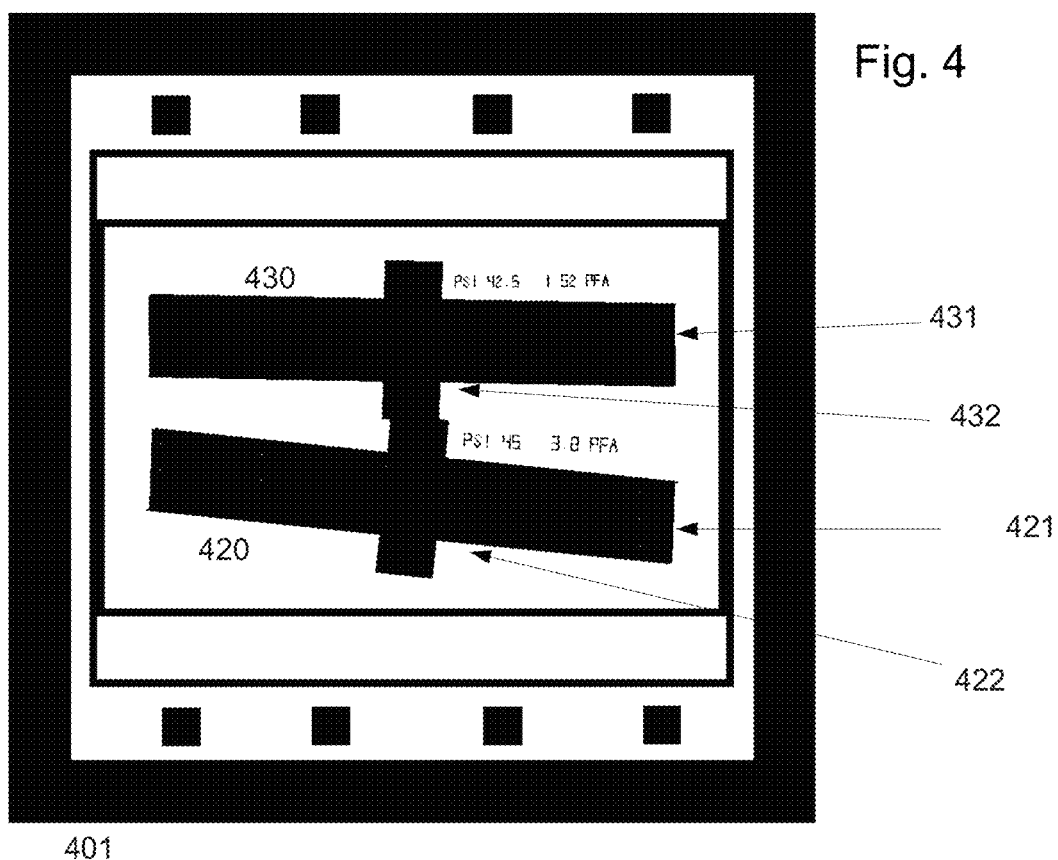

FIG. 4 depicts the layout of such a sensor packaged in a common 5×5 mm ceramic package.

Figure 5:
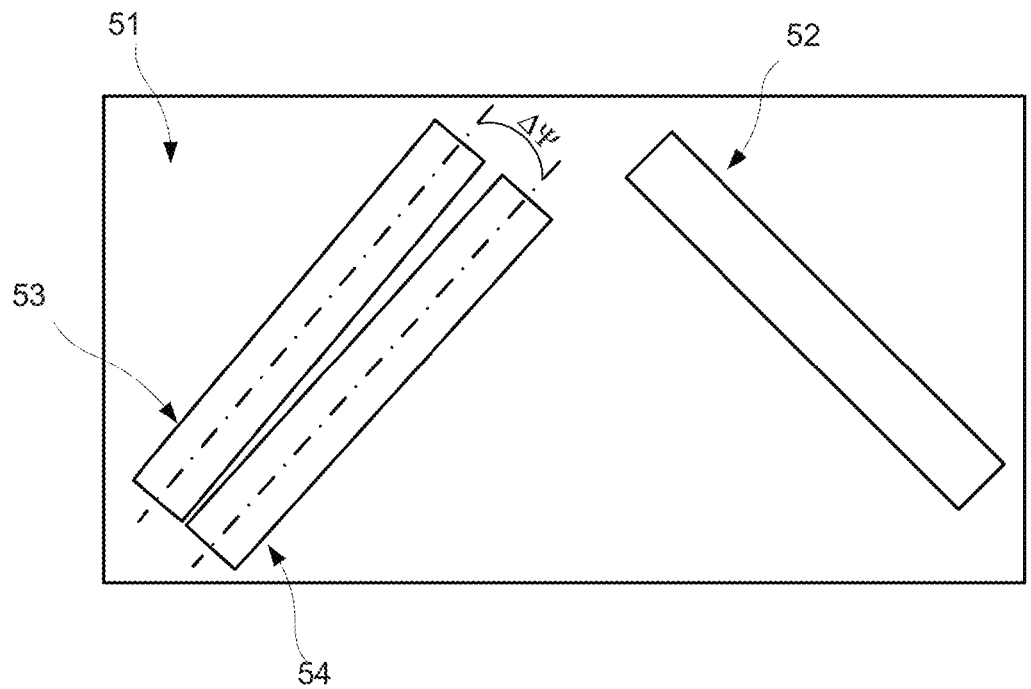

FIG. 5 shows a SAW based torque and temperature sensor.

Figure 6:
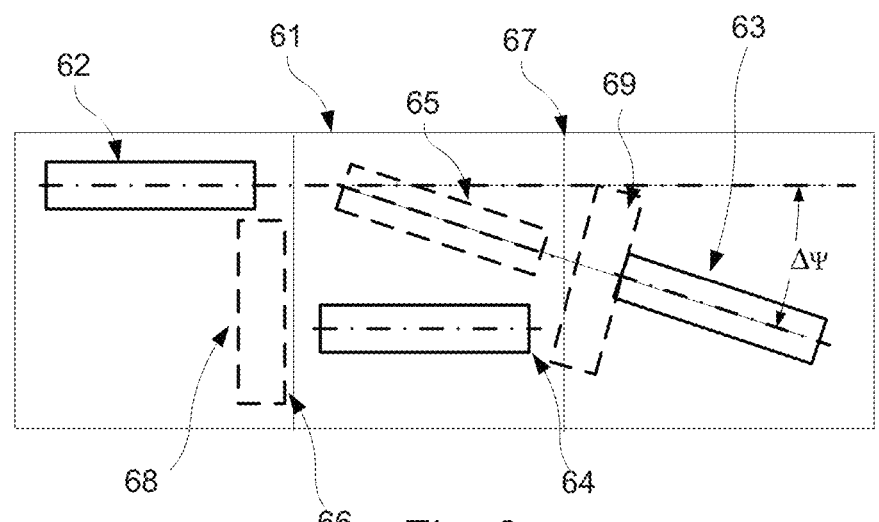

FIG. 6 shows a SAW based pressure monitoring device.

DETAILED DESCRIPTION

Figure 1:
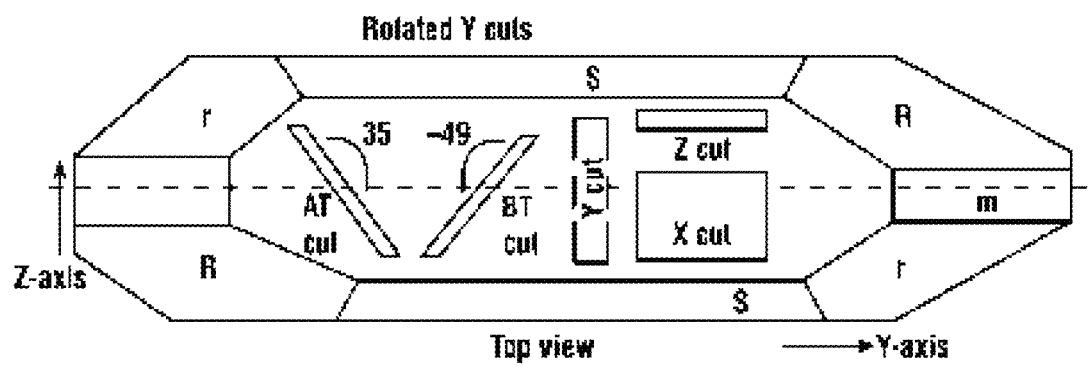
FIG. 1 depicts a natural crystal form of quartz.

FIG. 1 depicts a natural crystal form of quartz and defines the rotated Y cut angle as a rotation of the vector normal to the surface away from Y and towards Z. The Institute of Electrical and Electronic Engineers (IEEE) defined standard orientations of quartz crystals in IEEE Standard 176-1987. Reference to cut types, axis, and crystallographic orientations made in these specifications utilize orientations defined as YX\tlt\($\phi$°, $\theta$°, $\psi$°) where YX means the starting crystal has a plate normal along Y and propagation along X, tlt determines that the three rotations needed to attain an arbitrary orientation of a device are first about the thickness ($\phi$, herein constrained to approximately zero), then about the length (X) by an amount $\theta$, then having a propagation direction from X of $\psi°$. Thus crystal angles are presented herein in the form (0, $\theta$, $\psi$). It is noted that cuts having similar characteristics due to crystal symmetries fall within the scope of these specifications and claims, as such will be immediately recognized as equivalent by the skilled in the art. In particular, (0, $\theta$, $\psi$) and (0, $\theta$, $-\psi$) are identical by symmetry.

Figure 2:
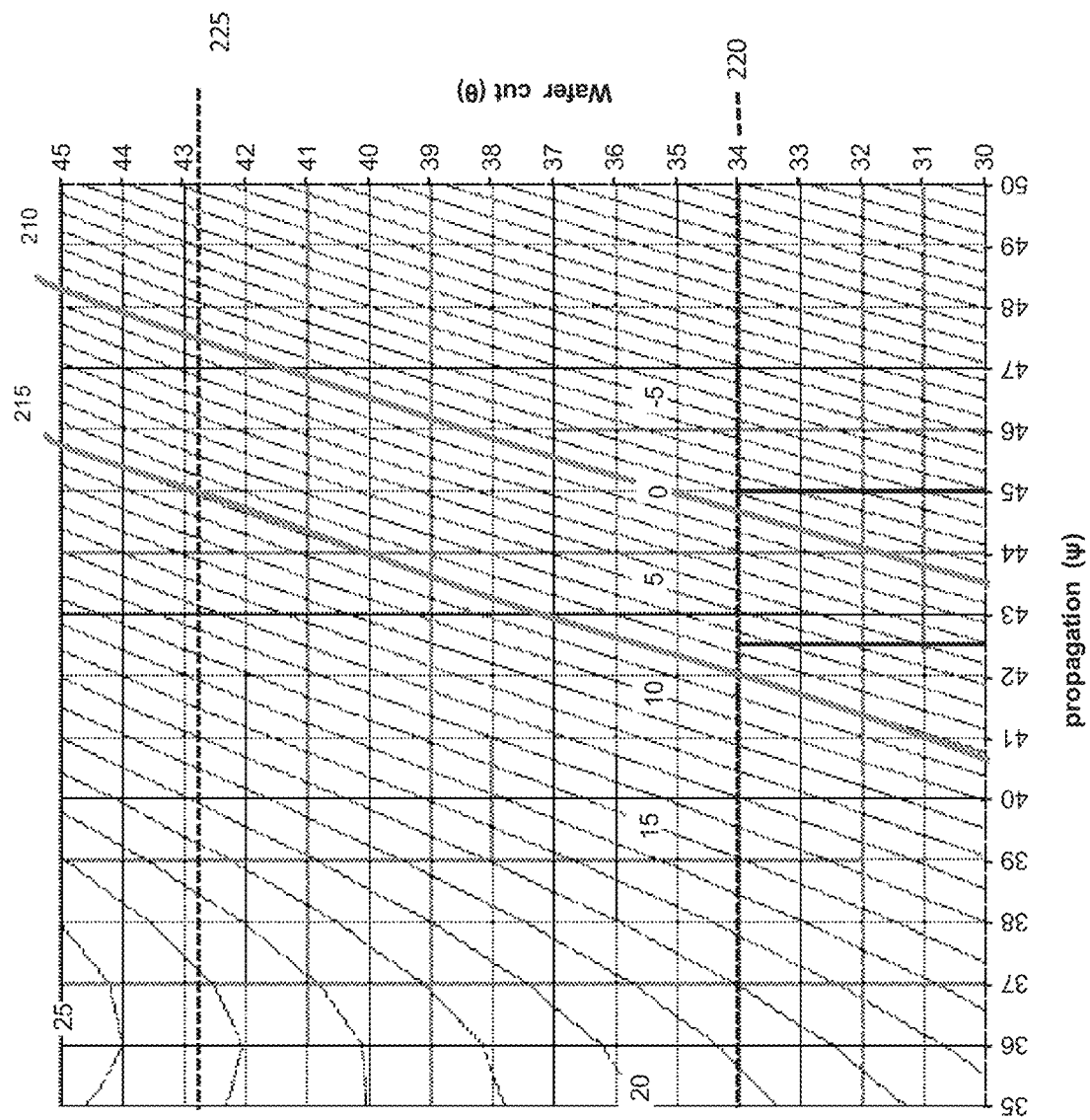
FIG. 2 depicts a section of a contour map of the temperature coefficient of frequency (TCF) of an individual SAW element on a quartz substrate.

FIG. 2 depicts a section of a contour map of the temperature coefficient of frequency (TCF) of an individual SAW element on a quartz substrate. The calculations or measurements are performed in the limiting case of negligibly thin metal, as would be preferred for delay lines. It is observed that the TCF of SAW resonators decreases with the addition of metal such as aluminum, requiring some correction from the figure. The vertical axis represents the rotated Y-cut angle, $\theta$, and the horizontal axis represents the propagation direction, $\psi$. Numbers within the graph area represent the TCF of the underlying curve. Horizontal lines 225 and 220 indicate the popular ST (42.75°) and 34° rotated Y-cuts (RYC), respectively. The contours for 8 ppm/° C. and 0 ppm/° C. are emphasized as 215 and 210 respectively. Vertical lines indicate the selected propagation directions, 42.5° and 45°, which adjust for metal thickness to obtain nominally balanced negative and positive temperature coefficient SAW resonators with a nominally 8 ppm/° C. differential sensitivity on 34° RYC.

FIG. 2 concentrates on quartz orientations between 30° rotated Y-cut and 45° rotated Y-cut in an area of rapid and linear variation of the TCF with propagation direction that extends below 0° and beyond 60° rotated Y cut. The contour lines 210, 215 correspond to 0 ppm/° C. and 8 ppm/° C. respectively, and are emphasized, as are the lines 220, 225 representing the commercially available 34° and 42.75° (ST) cuts respectively. It is seen that this selection of cuts offers pairs or propagation directions for differential SAW sensors separated by as little as 2.5° of propagation direction that can result in as much as 8 ppm/° C. of differential sensitivity. Further, the differential sensitivity between two propagation directions separated by a fixed amount does not vary significantly with alignment errors. Thus, if a photomask is created with a pair of sensor intended to have their major (longitudinal) axis located at propagation direction of 42.5° and 45° respectively, the sensitivity of the resulting device would not be significantly disturbed if the parts were slightly misaligned on the wafer.

It was found that the family of quartz crystal cuts between Y cut and 60° rotated Y cut provides many if not all of the desired characteristics described supra. Such cuts also exhibit a large and substantially linear dependence of the TCF on propagation direction extending above and below zero TCF. Preferably, differential sensors are obtained by placing a positive coefficient sensor element (PSAW hereinafter) on one side of the zero TCF angle, and a negative coefficient sensor element (NSAW hereinafter) on the opposite side of the zero TCF angle of the wafer for the desired device metal thickness. This provides a balanced sensor, having nearly equal sensitivity to misalignment errors of the photomask patterns onto a wafer.

Furthermore, the rate of change of TCF with angle on such quartz cuts allows creating a small and efficient sensor by placement of a pair of resonators on the same die, with a small geometric angle between their major axes. The frequency and TCF sensitivity of those resonators to metal thickness and line width variations common in typical SAW mass production are closely matched.

The above presented wafer orientation angles and associated propagation angles offer manageably small asymmetry such that the SAW velocity of both resonators is a slowly varying function of propagation angle and the power flow angle is manageably small. The power flow angle is the angle between the propagation direction of phase fronts of a wave (phase velocity vector, which defines $\psi$) and the direction in which acoustic power is transmitted (Poynting vector).

Furthermore, the reflection coefficient of aluminum strips is sufficient to obtain SAW resonators with high Q factor in a small size while the piezoelectric coupling is sufficiently large to obtain low resonant impedances for high electrical efficiency.

Differential temperature sensors according to some embodiments of the invention may be created in cuts which extend from Y cut ($\theta=0°$) to 55° rotated Y-cut, with a Y-cut between 28.5° and 42.75° being preferred, and with 34° being the most desirable. At Y-cut ($\theta=0°$), the average sensitivity of TCF to alignment is 2.35 ppm/° C. per degree of propagation angle separation between the resonators. By 28.5° rotated Y cut it is 3.07 ppm/° C. per degree. By 42.75° rotated Y cut it is 3.33 ppm/° C. per degree. Spectral limits of unlicensed wireless sensors favor differential sensitivity less than 20 ppm/° C. and meaningful resolution favors more than about 6 ppm/° C. Therefore a most desired angular spacing of propagation directions is in the range between 1.8 and 8.5°. Election of the specific difference of propagation directions is a matter of technical choice. The TCF varies linearly from about +10 ppm/° C. to about −20 ppm/° C. The application of temperature sensors in the field of wireless passive sensors is highly desirable. SAW resonators are best suited to operations as wireless passive sensors between about 300 MHz and 1 GHz where they offer small size and high resonant Q (long resonant ring times). Most operations of such sensors are done within the ISM allocated radio bands, such as the 433.05-434.79 MHZ band in Asia and Europe, or under periodic transmitter exceptions of the US Federal Communications Commission (FCC) Part 15. By way of example, frequency allocation limits of the European ISM bands dictate about 10 ppm/° C. on the magnitude of either resonator's TCF in a differential sensor directed to the frequency range of between 433.405 MHz and 434.535 MHz, providing mandatory transmitter margins of the ISM band. Preferably, the PSAW propagation direction is greater than $\psi_{min}=28.5°+0.365*\theta$, and is less than the propagation direction of the NSAW, in order to maximize linearity and maintain less than a +10 ppm/° C. slope. Similarly, the NSAW angle is preferably less than $\psi_{max}=37.0+0.310*\theta$. Thus the span between these angles is less then 8.5°−0.055*$\theta$.

The preferred range of quartz cuts and propagation angles of the invention is thus:

$$0°<\theta<55°$$

$$28.5°+0.365*\theta \leq \psi_{PSAW}$$

$$\psi_{NSAW} \leq 37.0+0.310*\theta$$

$$1.8° \leq \psi_{NSAW}-\psi_{PSAW} \leq 8.5°$$

$$|\Phi| \sim 0 (i.e. \leq 1.8°)$$

where 1.8° is taken to be a significant misalignment. Standard wafers are sold with a tolerance of ±0.25°.

Lower values of θ present better piezoelectric coupling and better reflectivity of the aluminum strips, resulting in higher resonant quality factor (Q) resonators with thinner aluminum. There is a range between 14° and 30° rotated Y cut in which the sensitivity of frequency to misalignment is minimized. Simulations indicate that in cut angles lower than 34°, the absolute frequencies become less dependent on manufacturing tolerances but that by 28.5° rotated Y cut the differential temperature coefficient's sensitivity to misalignment became too large. This would result in excessive variability in sensor performance in mass production and would require individual calibration of sensors.

Using a rotated Y cut angle higher than 34°, such as 42.75° by way of example, improved the stability of differential properties to manufacturing variations but provided worse control of absolute frequencies. The result is a part needing no calibration but having low manufacturing yield. Furthermore at or above 42.75° the power flow angle (PFA) is excessive and the piezoelectric coupling is low.

As is well known to the skilled in the art, designing a specific device is almost always a compromise between several desired characteristics, as well as cost. The selection of the desired quartz cut is a matter of technical choice and in light of the teachings provided herein the skilled in the art would be able to select the desired cut, power angles, metallization, precision, and the like, to meet the desired design parameters.

Tables 1 and 2 provide key device design properties of exemplary positive and negative coefficient elements for three quartz orientations.

TABLE 1

PSAW Design Parameters
Positive Coefficient SAW Design

| Parameter | 28.5 RYC | 34 RYC | 42.75 RYC | |
|---|---|---|---|---|
| PSAW direction | 39 | 42 | 46.5 | ° |
| PSAW Power flow angle | −0.15 | 1.35 | 6.2 | ° |
| Velocity | 3258 | 3257 | 3284 | m/s |
| Piezoelectric coupling | 0.0013 | 0.0012 | 0.0010 | $k^2$ |
| Reflectivity of electrodes (Kappa) | 0.0146 | 0.0128 | 0.0153 | κ/λ |
| Phase of Kappa | 91.4 | 103.1 | 110.4 | ° |

TABLE 2

NSAW Design Properties
Negative Coefficient SAW Design

| Parameter | 28.5 RYC | 34 RYC | 42.75 RYC | |
|---|---|---|---|---|
| NSAW Direction | 42 | 45 | 49 | ° |
| NSAW Power flow angle | 1.25 | 4.62 | 8.9 | ° |
| Velocity | 3259 | 3264 | 3302 | m/s |
| Piezoelectric coupling | 0.0011 | 0.001 | 0.0008 | $k^2$ |
| Reflectivity of electrodes (Kappa) | 0.0142 | 0.0142 | 0.0172 | κ/λ |
| Phase of Kappa | 98.1 | 108.5 | 113.6 | ° |

Table 3 presents the sensitivity of the PSAW, NSAW, and differential TCF to misalignment and metal thickness variations for the examples provided above. Also shown are the tolerances of the design parameter. The differential sensitivity to temperature is most tolerant to metal (160 nm tolerance) and alignment (0.42°) at 42.75 whereas the tolerance to alignment angle becomes very significant for 28.5° RYC.

TABLE 3

Manufacturing tolerances for differential sensitivity
Differential TCF Reproducibility

| Parameter | 28.5 RYC | 34 RYC | 42.75 RYC | |
|---|---|---|---|---|
| $\partial TCF_{PSAW}/\partial h$ | −0.0073 | −0.0085 | −0.0091 | ppm/K/nm |
| | 137 | 118 | 110 | nm tolerance |
| $\partial TCF_{NSAW}/\partial h$ | −0.0063 | −0.0069 | −0.0086 | ppm/K/nm |
| | 159 | 145 | 116 | nm tolerance |
| $\partial TC\Delta F/\partial h$ | 0.001 | 0.0015 | 0.0005 | ppm/K/nm |
| | 80 | 53 | 160 | nm tolerance |
| $\partial TCF_{PSAW}/\partial \Psi$ | −1.8 | −2.79 | −3.37 | ppm/K/° |
| | 0.56 | 0.36 | 0.30 | ° alignment tolerance |
| $\partial TCF_{NSAW}/\partial \Psi$ | −2.75 | −3.18 | −3.59 | ppm/K/° |
| | 0.36 | 0.31 | 0.28 | ° alignment tolerance |
| $\partial TC\Delta F/\partial \Psi$ | −0.89 | −0.39 | −0.19 | ppm/K/° |
| | 0.09 | 0.21 | 0.42 | ° alignment tolerance |

The quantities in the table are derivatives with respect to thickness, ∂<property>/∂h, and angle, ∂<property>/∂ψ, where <property> is either TCF or TCΔF. The properties are the temperature coefficient of absolute frequency, TCF, of the PSAW and NSAW and the temperature coefficient of difference frequency, TCΔF, between the two SAW resonators. The top value is the quantity of the derivative in the units given to the right and the bottom value is the associated manufacturing tolerance to meet an assumed reproducibility. The target specifications are not important and the tolerances might be larger or smaller for looser or tighter specifications. What is of interest is the relative tolerance of one design to another and any requirements for absolute angular accuracy significantly under 0.2°. It is noted that the term Δ represents a difference between two related values, and the ∂ represents the calculus differential operator for a derivative.

Table 4 shows the absolute frequency and difference frequency dependence on these same manufacturing variables. The table presents the derivatives of the <property> to metal thickness and absolute propagation angle, respectively. In the table ∂<property>/∂h and ∂<property>/∂ψ where <property> is the PSAW frequency, the NSAW frequency or ΔF, which is the difference therebetween. Utilizing a 28.5° RYC substrate provides excellent stability of frequency against misalignment and metal thickness; even though it has lower stability of its sensing parameter (differential TCF). In contrast, sensors manufactured on 42.75° RYC substrate show lower stability of absolute and difference frequencies caused by manufacturing variations, but the 42.75° Y-cut reduces the variation in temperature sensitivity caused by manufacturing variations, as seen in Table 3.

TABLE 4

Dependence of the nominal frequencies and difference
frequency on alignment and metal thickness.
Frequency Tolerance Parameters

| Parameter | 28.5 RYC | 34 RYC | 42.75 RYC | |
|---|---|---|---|---|
| $\partial F_{PSAW}/\partial h$ | −8.545 | −7.695 | −6.01 | KHz/nm |
| | 11.70 | 13.00 | 16.64 | nm tolerance |
| $\partial F_{NSAW}/\partial h$ | −8.558 | −7.705 | −6.26 | KHz/nm |
| | 11.68 | 12.98 | 15.97 | nm tolerance |
| $\partial \Delta F/\partial h$ | 0.013 | 0.01 | 0.25 | KHz/nm |
| | 3846 | 5000 | 200 | nm tolerance |
| $\partial F_{PSAW}/\partial \Psi$ | −33 | 175 | 725 | KHz/° |
| | 3.03 | 0.57 | 0.14 | ° alignment tolerance |

TABLE 4-continued

Dependence of the nominal frequencies and difference
frequency on alignment and metal thickness.
Frequency Tolerance Parameters

| Parameter | 28.5 RYC | 34 RYC | 42.75 RYC | |
|---|---|---|---|---|
| $\partial F_{NSAW}/\partial \Psi$ | 109 | 425 | 1068 | KHz/° |
| | 0.92 | 0.24 | 0.09 | ° alignment tolerance |
| $\partial F\Delta/\partial \Psi$ | 142 | 250 | 343 | KHz/° |
| | 0.35 | 0.2 | 0.15 | ° alignment tolerance |

Therefore certain preferred embodiments of the invention are thus defined by:

$$28.5° < \theta < 42.75°$$

$$28.5° + 0.365*\theta \leq \psi_{PSAW}$$

$$\psi_{NSAW} \leq 37.0 + 0.310*\theta$$

$$1.8° \leq \psi_{NSAW} - \psi_{PSAW} \leq 8.5°$$

$$|\Phi| \sim 0 (i.e. \leq 1.8°)$$

where 1.8° is taken to be a significant misalignment. Standard wafers are sold with a tolerance of ±0.25°.

Preferably, the inventions practiced with θ=34°±2° and with 37.5°≤ψ≤47.5. The most preferable embodiment employs a 34° rotated Y cut substrate with a PSAW propagation direction of 42.5°±1° and an NSAW propagation direction of 45°±1°, having 2.5° therebetween. Such a design would operate over a 200° C. temperature span in the European ISM band. At operating frequencies between 425 MHz to 442 MHz, aluminum thicknesses below 250 nm resulted in relatively large devices with lower Q than desired. At metal thicknesses in excess of 350 nm the variability becomes excessive. The preferred embodiment employs a metal thickness between these limits.

FIG. 3 shows by way of non-limiting example, a theoretical design of a differential sensor on 34° rotated Y cut quartz and using 42.5° propagation angle to create a positive temperature coefficient SAW (PSAW) and using 45° propagation angle to create a negative temperature coefficient SAW (NSAW). The sensor is targeted for the European ISM band with upper (301) and lower (300) frequency limits indicated. The radio frequency operation of a typical wireless system requires the transmitter remain within the guardband limits indicated by 302 and 303. In the limit of negligibly thin metal FIG. 2 suggests temperature coefficients of +6.5 ppm/° C. (+2.8 KHz/° C. at 434 MHz) and −1 ppm/° C. (−0.4 KHz/° C. at 434 MHz), respectively. With target nominal metal thickness of between 280-320 nm, the theoretical individual SAW TCF would be approximately equal and opposite, as generally indicated by curves 320 and 330.

FIG. 3 shows the expected PSAW frequency vs. temperature as designed 330. Curve 331 depicts the results of a −0.25° misalignment and −20 nm aluminum thickness error. A +0.25° misalignment and −20 nm aluminum thickness deviation is depicted by curve 332. Curve 333 depicts the results of a +0.25° misalignment and +20 nm aluminum thickness deviation. Similarly, curve 334 depicts similar effects for +0.25° misalignment and +20 nm aluminum deviation. It can be seen that absolute frequency varies strongest with metal thickness while TCF varies strongest with alignment.

FIG. 3 also shows the expected NSAW frequency vs. temperature as designed 320, with curve 321 depicting the variations of −0.25° misalignment and −20 nm aluminum thickness deviation, curve 322 depicting a +0.25° misalignment and −20 nm aluminum thickness variation, curve 323 depicting a +0.25° misalignment and +20 nm aluminum thickness deviation, and curve 324 depicting a +0.25° misalignment and +20 nm aluminum thickness deviation. It is seen that absolute frequency varies in the same direction and approximate magnitude as the PSAW with metal thickness. Therefore the design provides significant compensation of the difference frequency despite manufacturing variations. It is also seen that TCF varies in the same direction and approximate magnitude as the PSAW with alignment, compensating the differential sensitivity.

A typical resonator in the ISM band at 433.75 MHz is 3-4 mm long and, inclusive of the bus bars and dicing, about 1 mm wide. A parallel pair of separately diced resonators would be approximately 2 mm×4 mm or twice the width dimensions of the single resonator.

FIG. 4 depicts a sensor comprising two resonators: a NSAW 420 disposed at propagation angle of 45° and a PSAW 430 disposed at propagation angle 42.5°. The sensor is schematically depicted in standard 5 mm×5 mm ceramic package 401. It is noted that the inner bond pad is shared and no clearance is needed for a dicing lane between the two resonators, offering an immediate savings of about 20% for the monolithic resonator over two discrete devices. FIG. 4 depicts the resonators as having a slight parallelogram distortion to account for differences between the phase velocity direction (propagation angle, ψ) 421, 431 used in predicting device properties and the direction of power flow (power angle) 422, 432. When propagating at a non-zero angle from the crystal X axis, power does not flow parallel to the phase velocity vector and the difference between the angular direction of power flow (Poynting Vector) and the angular propagation direction of the phase velocity vector, called the power flow angle, is a function of the propagation angle, ψ. The 2.3° difference in this angle for the two selected propagation directions results in a net 4.8° between the longitudinal axis of the resonators, which necessarily follows the power angle of the resonator.

Generally it would be desirable to maintain an angle between the bus bars of the two devices of under 10° and more preferably under 5°. At 10° utilizing 4 mm long resonators, the wasted lateral space is 0.7 mm, or an increase of 35% in die size relative to a single resonator, and at 5° it is 0.35 mm, or about 18%. In contrast in the 18° and higher angles of prior devices the wasted space exceeds 1 mm (50%). In addition to reducing the wasted wafer material, the resulting sensor also fits into a smaller and less expensive ceramic package and the smaller package fits within a smaller module.

While these direct cost advantages are desirable, the more significant advantages are the improved tracking of the sensitivity of the individual resonator frequencies to manufacturing variations. The improved correlation of manufacturing variations allows seemingly looser tolerances on the absolute frequencies, improving yield or allowing smaller frequency bands to be allocated to individual sensors.

Whereas the prior art has required at least a 15° angle difference to obtain only a 4 ppm/° C. (1.7 KHz/° C.) sensitivity, aspects of the present invention attain twice this sensitivity in under 5° angular difference.

Table 5 presents measured TCF data for 260 nm thick and 315 nm thick aluminum resonator patterns on three different propagation directions on 34° rotated Y cut wafers. The sensitivity of TCF to metal thickness variation and to misalignment is estimated for ±10 nm variability at a metal ratio (line width/line period), M, of 40%. The data is presented as ∂TCF/∂ (Mh) and for a ±1° alignment error, presented as ∂TCF/∂($\psi_v$). The derivative ∂ of the TCF to the product of metal ratio (M), and thickness (h), —the effective metal thickness—is ∂TCF/∂(Mh) and the derivative ∂ with respect to absolute angle is ∂TCF/∂$\psi_v$, where subscript v denotes the velocity propagation angle. The table presents data for the selected PSAW propagation direction, 42.5°, and the selected NSAW propagation direction, 45°. For comparison, a propagation direction that minimizes the single-SAW sensitivity to these manufacturing variations is presented, namely 38° propagation angle. The table also presents the differential data between the 42.5° and 45° resonators.

Typically a sensor will be calibrated to ambient conditions at installation—a process known as single-point calibration. This corrects for manufacturing variations in the difference frequency of a known condition(s), with little effort by the installer. The sensitivity, however, is not typically easy to calibrate and the manufacturing variations must be maintained within desired tolerances. The estimated error for individual sensor elements at 125° C. after a single point calibration at 25° C. is calculated as 100 times the variation in temperature sensitivity due to angular and metal thickness variations. Table 5 presents data from such estimations for single resonator sensors and shows that the best case error still exceeds 25° C. which is considered excessive. The single SAW sensors are then compared to a differential element comprising a PSAW element with 42.5° propagation and an NSAW resonator with 45° propagation. Correlation of sensitivity to manufacturing variation for the 42.5° and 45° differential pair at 315 nm shows better than ±5° C. reproducibility. This is accomplished without tightening the common process variations and without any trimming or calibration. Differential resonators with substantially larger angle between the devices do not offer such stability over alignment error or metal thickness as embodiments of the present invention. It is believed that differences of propagation angles up to 12.5° should offer sufficient compensation from manufacturing variations to be useful within the above specified parameters.

+0.53 KHz/° C. and the NSAW is reduced to −2.11 KHz/° C. The preferred embodiments meet this desired property over the range of suitable metal thicknesses.

In practical embodiments the SAW devices use similar resonant frequencies or delays, however a finite difference is required. A SAW device with an unloaded Q of 10,000 at 434 MHz will have a resonant bandwidth of 43.4 KHz and an impulse response duration with measurable signal to noise of about 20-25 μs. In order to interrogate such a resonator wirelessly, a pulse train with similar bandwidth and time scale is needed. In order to avoid interference from the other resonator, a minimum frequency separation of about 4-5 bandwidths must be provided. Therefore, one operating temperature limit is determined by the temperature at which the two resonant frequencies become less than 200 KHz apart.

Wirelessly interrogating a SAW sensor to an accuracy of better than 1° C. requires a normalized differential sensitivity of at least 4 parts per million per ° C. For the 434 MHz ISM band, this is a minimum of 1.7 KHz/° C. To obtain ±5° C. at ±100° C. from the reference temperature requires that the temperature sensitivity be reproducible and stable to within 5% of the nominal value. It is seen from Table 5 that embodiments of the present invention exceed the required sensitivity while attaining the required reproducibility.

The specifications provided supra describe quartz crystallographic cuts with favorable characteristics for monolithic differential SAW temperature sensors having two resonators. In light of these specifications, the skilled in the art will recognize that similar structures may be utilized. By way of example, U.S. Pat. No. 7,795,779, which is incorporated herein by reference (also published as WO2006/123085), discloses a strain/dynamic torque sensor 51 which utilizes a first 52 and a second 53 resonator sensor elements disposed at a differential propagation direction of 90°, and a third sensor 54, utilized for temperature measurement. FIG. 5 is similar but simplified version of FIG. 1 of the above identified patent. In the '779 patent, the angle of the third sensor element is measured from the horizontal and is less than or equal to 30°, making it more than or equal to 15° from either the first 52 or second 53 sensor elements.

TABLE 5

| angle ° | TCF @260 nm KHz/° | TCF @315 nm KHz/° | ∂TCF/∂ (Mh) KHz/° C./nm | ∂TCF/∂ ($\psi_v$) KHz/° C./$\psi$ | Temp error @125° C., ±10 nm | Temp error @125° C., ±1° | Max error @125° C., ±1°, ±10 nm |
|---|---|---|---|---|---|---|---|
| 38 | 5.199 | 4.282 | −0.0167 | −0.903 | ±3.9° C. | ±21.1° C. | ±25.0° C. |
| 42.5 | 2.024 | 0.527 | −0.0272 | −0.903 | ±51.7° C. | ±171.4° C. | ±223.0° C. |
| 45 | −0.880 | −2.105 | −0.0223 | −0.903 | ±10.6° C. | ±42.9° C. | ±53.5° C. |
| 45 & 42.5 | 2.904 | 2.631 | −0.0050 | −0.060 | ±1.9° C. | ±2.3° C. | ±4.2° C. |

As disclosed above, for practical reasons, it is desired that the frequency change in response to temperature change TCF of one resonator, will have an opposing slope to the other. This is advantageous as it improves spectral management—the difference between the temperature dependent resonant frequency of the two sensor elements grow twice as fast, and the transmission band of the two sensors can be better managed. If both sensor elements had the same sign of TCF then the frequency change of the more slowly varying element consumes frequency spectrum without contributing to the sensitivity. The simulations in the limit of negligibly thin metal suggested TCF of +2.8 KHz/° C. for the PSAW and −0.4 KHz/° C. for the NSAW respectively. At 260 nm the measured TCF are +2.02 KHz/° C. and −0.88 KHz/° C. respectively. At 315 nm the PSAW is reduced to Relocating the third sensor element 54 such that it is disposed at an angle ΔΨ which forms an angle difference of less than 12.5 to either the first 52 or second 53 sensor elements would enable temperature measurements of the same sensor, in accordance to the principles disclosed herein. Modifying the '779 device in this way would provide direct temperature measurement, allowing external compensation of the sensor provide torque measurement Similarly, U.S. Pat. No. 7,151,337 discloses a SAW based pressure monitoring device 61 utilizing three sensor elements, wherein a first and a second of those elements operate as a monolithic differential SAW temperature sensor. FIG. 6 is a similar but simplified version of FIG. 1A of the '337 patent, which shows the first 62, second 63, and third 64 resonator sensor elements placement with the angle ΔΨ between the first 62 and second 63 resonators used for temperature measurement of 18°. However if the angle Ψ is selected to be less than 12.5° while utilizing the rotated Y-cuts orientations disclosed in these specifications, the resulting device would offer a smaller (narrower) structure with less sensitivity of the temperature measurement to manufacturing variations.

Pressure-dependent SAW 64 may be disposed at a propagation direction of +45°. It is noted that, by using the symmetry properties of the quartz substrates, pressure insensitive SAW 62 may be locate perpendicular to pressure-dependent SAW 64 at −45° 68 and located on or to the left of support 66 to avoid strain from the applied pressure. It is further noted that temperature sensitive SAW 63 may be located adjacent to pressure-dependent SAW 64 at 42.5° 65 or may be rotated using symmetry to −42.5° and located on or to the right 69 of support 67 to avoid strain from the applied pressure. It will be readily apparent that other angles may be employed as described in these specifications. One skilled in the art will realize that by rotating SAW elements 62 and 63, a dramatic reduction in sensor quartz area may be obtained. The shorter sensor size will improve thermal equilibrium, reduce die cost, and reduce package cost, as well as obtaining the better common mode rejection inherent to the new orientation.

The skilled in the art will also realize that delay lines may be utilized as sensor elements using the same substrates and propagation directions in methods using differential delay time or differential phase shift. Similarly, the skilled in the art will readily understand that parameters other than frequency may be sensed to deduce the ambient temperature. While the disclosure supra have focused on the requirements of 434 MHz ISM bands in Europe, SAW resonator sensors may be employed in wireless interrogation into the low GHz. Since the Q decreases with frequency, wider frequency separations, and larger differential sensitivity would be required. The optimization towards 34° rotated Y cut is driven by the constraints of the ISM band and other orientations in the range of 0 to 55° rotated Y cut, as broadly specified, and meeting the other constraints may be preferred under different spectral management assumptions.

It will be obvious to the skilled in the art that the invention may be applied to "wired" sensors in which the resonators or delay lines are utilized to stabilize oscillators.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

The invention claimed is:

1. A Surface Acoustic Wave (SAW) device comprising:
a plurality of SAW elements, comprising at least a first SAW element and a second SAW element, fabricated on a cut of quartz selected from the group consisting of: the families having $|\phi|$ substantially zero; $0^*\leq\theta\leq55°$; and rotational equivalents thereof,
wherein said first SAW element has a propagation direction aligned with ψPSAW and said second SAW element has a propagation direction aligned with ψNSAW and wherein |ψPSAW| and |ψNSAW| obey the constraints:

$$28.5°+0.365*\theta \leq |\psi PSAW|,$$

$$|\psi PSAW| < |\psi NSAW|,$$

$$|\Psi NSAW| \leq 37.0+0.310*\theta,$$

$$1.8° \leq |\psi NSAW| - |\psi PSAW| \leq 8.5°, \text{ and}$$

rotational equivalents thereof.

2. The SAW device according to claim 1, wherein $28°\leq\theta\leq55°$.

3. The SAW device according to claim 2, wherein $\theta=34°$.

4. The SAW device according to claim 3, wherein $42°\leq\psi PSAW\leq43°$, $44.5°\leq\Psi NSAW\leq45.5°$.

5. The SAW device according claim 1, wherein at least one of the first or second SAW elements is a SAW resonator.

6. The SAW device according to claim 1, wherein at least one of the first or second SAW elements is a one-port SAW resonator.

7. The SAW device according to claim 1, wherein at least one of the first or the second SAW elements is a SAW delay line.

8. The SAW device according to claim 1, in which at least one of the first or second SAW elements having metallization that is primarily aluminum.

9. The SAW device according to claim 1, wherein the first or the second SAW elements having metallization, and wherein the frequency-thickness product of the metallization is less than 442 MHz*350 nm.

10. The SAW device according to claim 1, wherein the first or the second SAW elements having metallization, and wherein the frequency-thickness product of the metallization is less than 442 MHz*250 nm.

11. The SAW device according to claim 1, wherein the first and second SAW elements are disposed such that their respective propagation direction form an angle δΨ to each other, wherein $1.8°\leq\delta\Psi\leq8.5°$.

12. The SAW device according to claim 1, wherein one of the first and second SAW elements is disposed at a propagation angle $44.5°\leq\Psi one\leq45.5°$, Ψone being the propagation angle of the one SAW element.

13. The SAW device according to claim 1, further comprising a third SAW element.

14. The SAW device according to claim 13, wherein the third SAW element is disposed at an angle $-45.5°\leq\Psi third\leq-44.5°$, Ψthird being the propagation angle of the third SAW element.

* * * * *